United States Patent [19]
Huang et al.

[11] Patent Number: 6,010,944
[45] Date of Patent: Jan. 4, 2000

[54] METHOD FOR INCREASING CAPACITY OF A CAPACITOR

[75] Inventors: Chi-Dar Huang; Chih-Hsun Chu; Chien-Hung Chen, all of Hsin-Chu, Taiwan

[73] Assignee: Mosel Vitelic Incorporated, Hsin-Chu, Taiwan

[21] Appl. No.: 09/059,364

[22] Filed: Apr. 14, 1998

[30] Foreign Application Priority Data

Dec. 2, 1997 [TW] Taiwan .................................... 8611869

[51] Int. Cl.$^7$ .................................................. H01L 21/20
[52] U.S. Cl. ............................................. 438/398; 438/381
[58] Field of Search .................................... 438/398, 964, 438/253–255, 397, 381, 396; 257/306–307, 309–310

[56] References Cited

U.S. PATENT DOCUMENTS

| 5,286,668 | 2/1994 | Chou | 438/255 |
| 5,744,387 | 4/1998 | Tseng | 438/253 |
| 5,766,995 | 6/1998 | Wu | 438/255 |

*Primary Examiner*—Charles Bowers
*Assistant Examiner*—Craig Thompson
*Attorney, Agent, or Firm*—Bacon & Thomas

[57] ABSTRACT

The present invention relates to a method for increasing capacity of a capacitor. The method includes forming a polysilicon spacer on sidewall of a first polysilicon electrode and then treating the polysilicon spacer with a phosphoric acid to form a roughened surface area on the polysilicon spacer and the first polysilicon electrode. By this arrangement, the overall surface area of the polysilicon spacer and the first polysilicon electrode can be increased and the capacity of a capacitor can be increased accordingly.

8 Claims, 3 Drawing Sheets

6,010,944

METHOD FOR INCREASING CAPACITY OF A CAPACITOR

FIELD OF THE INVENTION

The present invention relates to a method for making a capacitor more particularly, to a method for increasing capacity of a capacitor.

DESCRIPTION OF PRIOR ART

Conventional capacitor is composed of two plate electrodes and a dielectric layer therebetween. When used in an Integrated Circuit, a capacitor adopts a polysilicon layer as a plate electrode, and Oxide-Nitide-Oxide (ONO) as a dielectric layer. The processes for making a conventional Integrated Circuit capacitor include: (a) forming a first polysilicon electrode with designed pattern (b) depositing a dielectric layer of ONO (C) forming a second polysilicon electrode ith designed pattern.

The capacity of a capacitor is defined as: $C = \kappa \epsilon A/d$, wherein $\kappa$ is dielectric constant of the dielectric layer, $\epsilon$ being permittivity in vacuum, A being area of the plate electrode, and d being a distance between two plate electrodes (i.e. a thickness of the dielectric layer). Obviously seen from above formula, the capacity of a capacitor is proportional to the overall area of those two plate electrodes, while is reverse of the thickness of the thickness of the ONO. However, when the thickness of the ONO is lowered to the lowest limit, there is no way but increases the overall area of a plate electrode, which will render a device to consume a larger chip area. Therefore, there is a need to solve aforesaid problem and to provide a method for making a capacitor with a larger capacity, while maintaining the same occupied chip area.

SUMMARY OF THE INVENTION

It is the objective of this invention to provide a method for making a capacitor, wherein it is no need to increase the overall area of the device while a capacity of the capacitor can be incresed.

According to one aspect of the embodiments, the method for making a capacitor includes: (a) forming a polysilicon spacer on the sideall of a first polysilicon electrode (b) treating the polysilicon spacer and the first polysilicon electrode with a phosphoric acid to form a roughened surface. By this arrangement, the overall surface area of the polysilicon spacer and the polysilicon electrode, which are used as one plate electrode of a capacitor, can be increased and the capacity of a capacitor can be increased accordingly.

BRIEF DESCRIPTION OF DRAWINGS

In order that the present invention may more readily be understood the following description is given, merely by way of example with reference to the accompanying drawings, in which.

DETAIL DESCRIPTION OF PREFERRED EMBODIMENT

Figure 1:
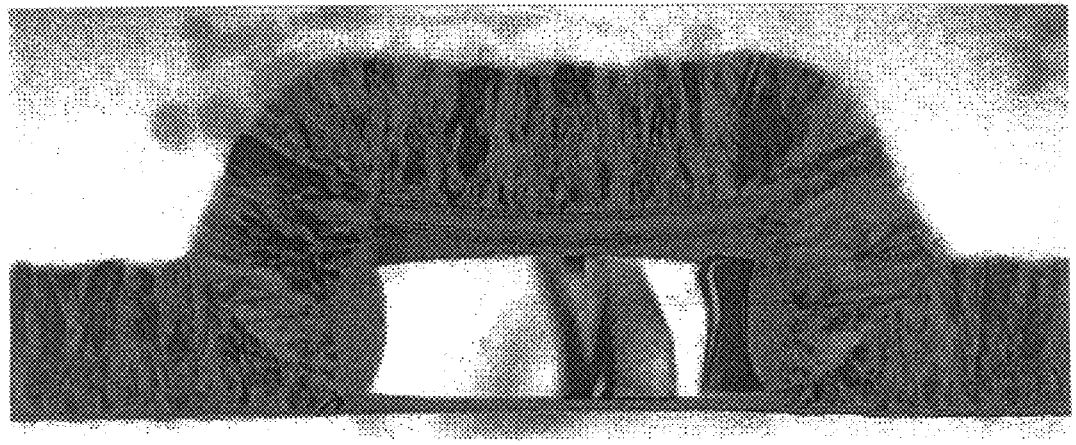
FIG. 1 is a longitudinal cross sectional view of the TEM (Transmission Electron Microscopy) of a polysilicon layer before it is treated by a phosphoric acid.
Figure 2:
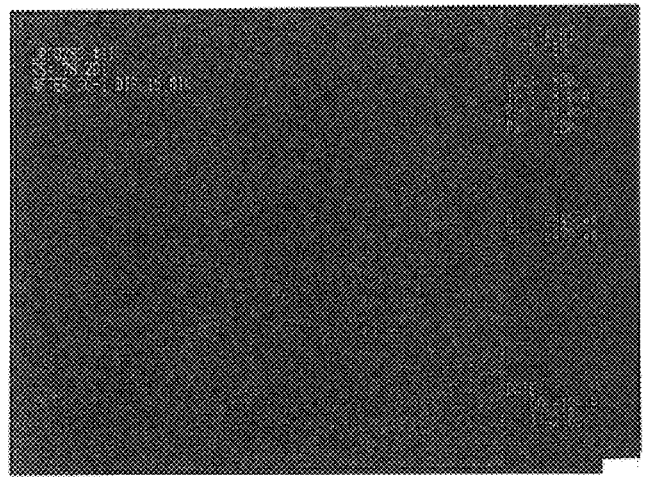
FIG. 2 is a top plan view of the SEM (Scanning Electron Microscopy) a of a polysilicon layer before it is treated by a phosphoric acid.
Figure 3:
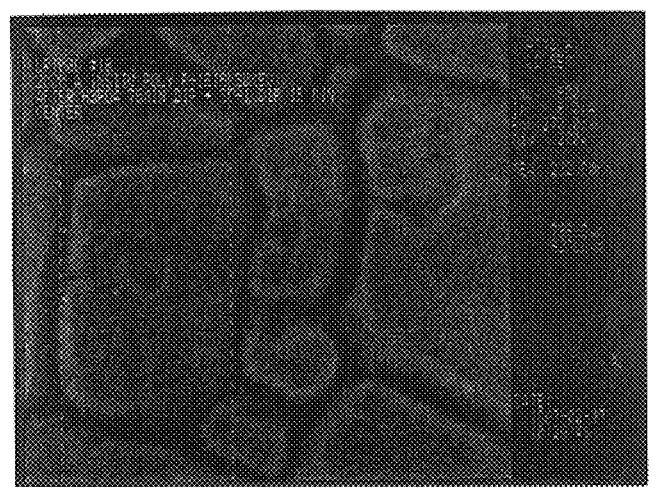
FIG. 3 is a top plan view of the SEM (Scanning Electron Microscopy) a of a polysilicon layer after it is treated by a phosphoric acid.

The present invention is mainly based on the facts described as follows. FIG. 1 is a longitudial cross sectional view of the TEM (Transmission Electron Microscopy) of a polysilicon layer before it is treated by a phosphoric acid. FIG. 2 is a top plan view of the SEM (Scanning Electron Microscopy) of the polysilicon layer before it is treated by the phosphoric acid. Since the surface of the polysilicon layer is smooth, no picture can be seen in FIG. 2. FIG. 3 is a top plan view of the SEM of the polysilicon layer after it is treated by the phosphoric acid. It can be readily found that a vertical etching is performed by the phorphoric acid along the top layer of the polysilicon layer and that the top surface of the polysilicon layer has been shaped to have a plurality of grains thereof. It is believed that the phosphoric acid may conduct an effective etching on the top surface such that a roughened surface on the polysilicon layer can be attained. By this arrangement, the overall surface area can be therefore increased. When this process is applied to a capacitor structure, the capacity of the capacitor can be increased while the overall occupied chip area remains unchanged.

Figure 4A:
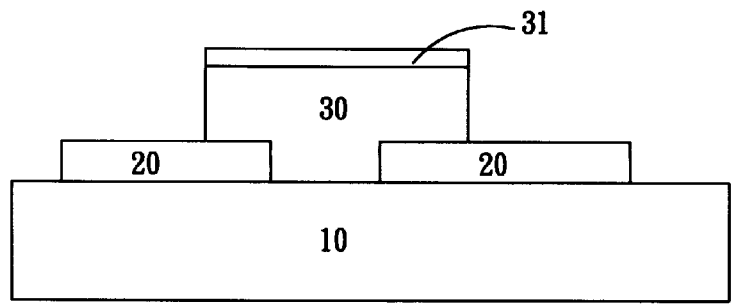
FIGS. 4A–4E are the cross sectional views of the main Processes applied in the present invention.

Referring to FIG. 4A, a first dielectric pattern layer 20, for example $SiO_2$, that is used as insulating layer is formed on a silicon substrate 10. The first dielectric pattern layer 20 is formed by depositing a thicker dielectric layer that has a thickness about 1500 to 2500 angstroms. Then this dielectric layer is treated with lithography, developing, and etching processes. Finally, the dielectric pattern is attained.

The first dielectric pattern layer 20 is further covered with a first polysilicon electrode 30 having a designed pattern and a cap oxide layer 31. The first polysilicon electrode 30 is to serve a bottom electrode of a capacitor and the cap oxide layer is to serve a protection over the first polysilicon electrode 30 during an etching process. The first polysilicon electrode 30 and the cap oxide layer 31 are attained through the following processes. Firstly, a layer of polysilicon having a thickness of 500–2000 angstroms and a cap oxide layer having a thickness of 100–150 angstroms are deposited.

Figure 4B:
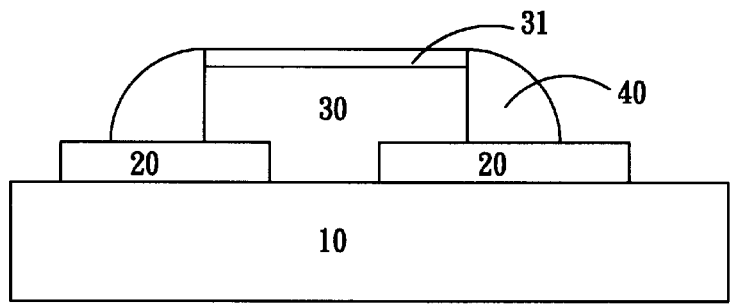

Then these two layers are performed with lithography, developing, and etching to attain the final result. Afterward, a deposition of another layer of polysilicon having a thickness of 1000–3000 angstrom is conducted. Then an etching process is conducted to etch off the original polysilicon layer, so only a polysilicon spacer 40 is remained on the sidewall of the first polysilicon electrode 30 and the cap oxide layer 31. In this etching process, the cap oxide layer 31 may protect the first polysilicon electrode 30 from being over-etched. The first polysilicon electrode 30 and the polysilicon spacer 40 serves a bottom electrode of a capacitor to increase the surface area of the electrode. As a result,the capacity is therefore increased, As clearly shown in FIG. 4B.

Figure 4C:
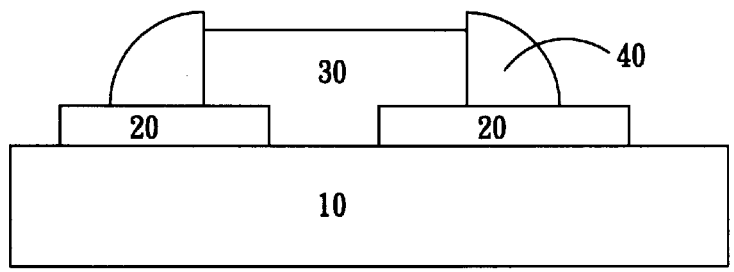
Figure 4D:
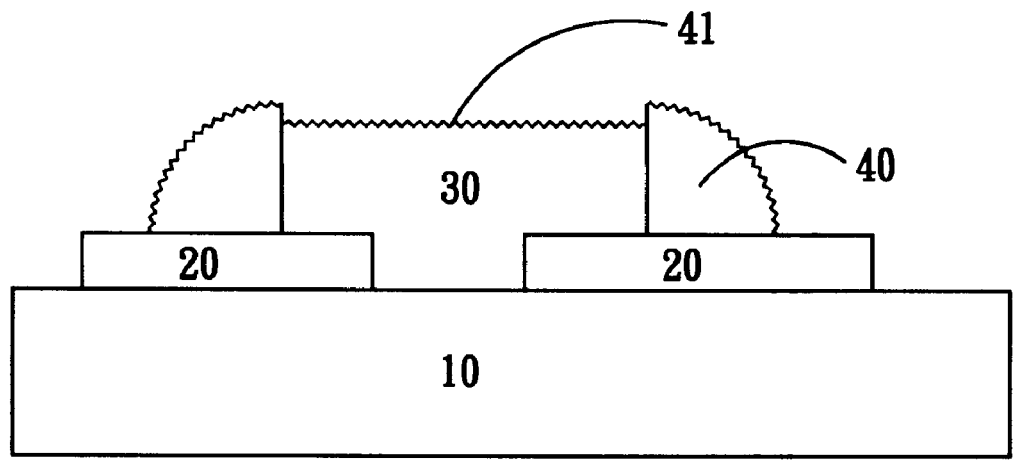
Figure 4E:
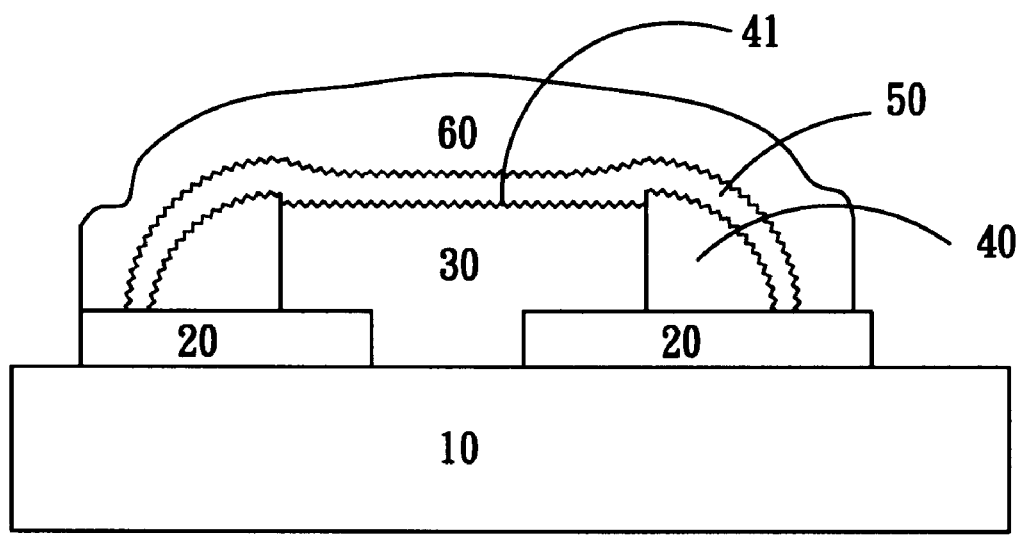

Afterward, the cap oxide layer 31 is etched off, as shown in FIG. 4c, and the overall chip is then immersed into a phosphoric acid, its temperature being 100–200° C. and etching speed being 40–90 angstrom/minute, to bring a roughened surface to the first polysilicon electrode 30 and the polysilicon spacer 40, as shown in FIG. 4D. By this arrangement, the surface area of the bottom electrode of the capacitor is increased. Subsequently, a second dielectric layer 50 that is to serve a dielectric layer of a capacitor is deposited. The dielectric layer material can be selected from ONO or the likes. Finally, a second polysilicon layer is deposited. This second polysilicon layer and the second dielectric layer 50 are treated with lithography, developing, and etching to form a second polysilicon electrode 60 having a designed pattern, which is to serve a top electrode of the capacitor as show in FIG. 4E. Thus processes of making a capacitor having a larger surface area of the plate electrode is finished.

Detailed Description Of The Second Preferred Embodiment

The processes of the second preferred embodiment are the same as those of the first Preferred embodiment except forming a process of forming a cap oxide layer 31 because the cap oxide layer 31 is optional not necessary. The key processes of the second preferred embodiment include: (a) forming a first dielectric pattern layer for example $SiO_2$ (b) forming a first polysilicon electrode with a designed pattern on the first dielectric pattern layer (c) forming a polysilicon spacer on the sidewall of the first polysilicon electrode (d) the chip being immersed in a phosphoric acid (e) forming a second dielectric layer such as ONO (f) forming a second polysilicon electrode with a designed pattern.

By comparing the above two preferred embodiments and the conventional art, the surface area of a capacitor can be readily increased by roughening surface of the polysilicon spacer 40 and the first polysilicon electrode 30 with a phosphoric acid. As the surface area is increased, the capacity of a capacitor is considerably increased as compared with the conventional one.

While particular embodiment of the present invention has been illustrated and described, it would be obvious to those skilled in the art that various other changes and modifications can be made with departing from the spirit and scope of the invention. It is therefore intended to cover in the appened claim all such changes and modifications that are within the scope of the present invention.

What is claimed is:

1. A method for increasing capacity of a capacitor, comprising:

forming a first dielectric pattern layer on a silicon substrate by depositing a first dielectric layer and then patterned through lithography, developing, and etching the first dielectric layer;

depositing a first polysilicon layer;

forming a first polysilicon electrode having a given pattern through lithography, developing, and etching the first polysilicon layer;

depositing a second dielectric layer that is serve a dielectric medium of the capacitor and a second polysoilicon layer; and forming a second polysilicon electrode through lithography, developing, and etching the second dielectric layer and the second polysilicon layer;

characterized in that further processes are inserted after forming the first polysilicon electrode and before depositing the second dielectric layer, which include:

depositing a further polysililon layer and etching said further polysilicon layer such that a polysilicon spacer is formed on the sidewall of the first polysilicon electrode; and subsequently treating with a phosphoric acid such that a roughened surface area on the first polysilicon electrode and the polysilicon spacer is performed.

2. A method for increasing capacity of a capacitor according to claim 1, wherein the material of the first dielectric layer is $SiO_2$.

3. A method for increasing capacity of a capacitor according to claim 1, wherein the material of the second dielectric layer is Oxide-Nitride-Oxide (ONO).

4. A method for increasing capacity of a capacitor according to claim 1, wherein the temperature of the phosphoric acid is 100–200° C. and its etching speed is 40–90 angstrom/minute.

5. A method for increasing capacity of a capacitor, comprising:

forming a first dielectric pattern layer on a silicon substrate by depositing a first dielectric layer and then patterned through lithography, developing, and etching the first dielectric layer;

depositing a first polysilicon layer and a cap oxide layer;

forming a first polysilicon electrode having a given pattern through lithography, developing, and etching the first polysilicon layer and the cap oxide layer;

depositing a second dielectric layer that is serve a dielectric medium of the capacitor and a second polysoilicon layer; and forming a second polysilicon electrode through lithography, developing, and etching the second dielectric layer and the second polysilicon layer;

characterized in that further processes are inserted after forming the first polysilicon electrode and before depositing the second dielectric layer, which include:

depositing a further polysililon layer and etching said further polysilicon layer such that a polysilicon spacer is formed on the sidewall of the first polysilicon electrode and the cap oxide layer; and etching off the cap oxide layer and then treating with a phosphoric acid such that a roughened surface area on the first polysilicon electrode and the polysilicon spacer is performed.

6. A method for increasing capacity of a capacitor according to claim 1, wherein the material of the first dielectric layer is $SiO_2$.

7. A method for increasing capacity of a capacitor according to claim 1, wherein the material of the second dielectric layer is Oxide-Nitride-Oxide (ONO).

8. A method for increasing capacity of a capacitor according to claim 1, wherein the temperature of the phosphoric acid is 100–200° C. and its etching speed is 40–90 angstrom/minute.

* * * * *